(12) United States Patent
Wu

(10) Patent No.: US 12,424,555 B2
(45) Date of Patent: Sep. 23, 2025

(54) SEMICONDUCTOR STRUCTURE AND SEMICONDUCTOR DEVICE

(71) Applicant: CHANGXIN MEMORY TECHNOLOGIES, INC., Hefei (CN)

(72) Inventor: Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 434 days.

(21) Appl. No.: 18/153,447

(22) Filed: Jan. 12, 2023

(65) Prior Publication Data

US 2023/0154853 A1 May 18, 2023

Related U.S. Application Data

(63) Continuation of application No. PCT/CN2022/110344, filed on Aug. 4, 2022.

(30) Foreign Application Priority Data

Sep. 7, 2021 (CN) ......................... 202111042445.2

(51) Int. Cl.
*H01L 23/532* (2006.01)
*H01L 21/768* (2006.01)
(Continued)

(52) U.S. Cl.
CPC ...... *H01L 23/5329* (2013.01); *H01L 21/7682* (2013.01); *H01L 21/76831* (2013.01);
(Continued)

(58) Field of Classification Search
CPC ........... H01L 23/53295; H01L 23/5329; H01L 23/5226; H01L 23/53214; H01L 21/7682; H01L 21/76831; H01L 21/76834
See application file for complete search history.

(56) References Cited

U.S. PATENT DOCUMENTS 7,741,228 B2 * 6/2010 Ueki .................. H01L 21/7682
257/E21.573
8,779,590 B2 * 7/2014 Isobayashi .......... H01L 21/3212
257/751
(Continued)

FOREIGN PATENT DOCUMENTS

CN 103579092 A 2/2014
CN 207165559 U 3/2018
(Continued)

OTHER PUBLICATIONS

International Search Report cited in PCT/CN2022/110344 mailed Oct. 9, 2022, 9 pages.
(Continued)

*Primary Examiner* — Zandra V Smith
*Assistant Examiner* — John M Parker
(74) *Attorney, Agent, or Firm* — SYNCODA LLC; Feng Ma

(57) ABSTRACT

The present disclosure provides a semiconductor structure and a semiconductor device. The semiconductor structure includes a first conductive layer, a first barrier layer, and an insulating layer. The first conductive layer includes at least two traces, and a recess is formed between two adjacent ones of the traces. The first barrier layer is provided on a sidewall of the recess. The insulating layer fills the recess, and an air gap is formed in the insulating layer located in the recess.

12 Claims, 8 Drawing Sheets

(51) Int. Cl.
  *H01L 23/00*     (2006.01)
  *H01L 23/522*    (2006.01)
  *H10B 12/00*     (2023.01)

(52) U.S. Cl.
  CPC .... *H01L 23/5226* (2013.01); *H01L 23/53214* (2013.01); *H01L 23/564* (2013.01); *H10B 12/50* (2023.02)

(56) References Cited

U.S. PATENT DOCUMENTS

| | | | |
|---|---|---|---|
| 8,871,638 B2 | 10/2014 | Lee | |
| 9,305,836 B1 * | 4/2016 | Gates | H01L 21/76864 |
| 9,396,989 B2 * | 7/2016 | Purayath | H01J 37/32357 |
| 9,812,450 B2 * | 11/2017 | Baek | H10D 84/834 |
| 10,707,120 B1 | 7/2020 | Yami et al. | |
| 11,984,357 B2 * | 5/2024 | Zhu | H01L 23/5283 |
| 11,990,400 B2 * | 5/2024 | Lo | H01L 23/5386 |
| 12,300,599 B2 * | 5/2025 | Lu | H01L 21/7682 |
| 2009/0298282 A1 | 12/2009 | Yun et al. | |
| 2010/0093168 A1 * | 4/2010 | Naik | H01L 21/76834 438/618 |
| 2013/0207269 A1 * | 8/2013 | Oshida | A61F 13/34 257/762 |
| 2014/0073128 A1 | 3/2014 | Jong | |
| 2018/0033691 A1 * | 2/2018 | You | H01L 23/53295 |
| 2018/0151490 A1 * | 5/2018 | Yim | H01L 21/76834 |
| 2021/0193505 A1 | 6/2021 | Huang et al. | |

FOREIGN PATENT DOCUMENTS

| | | |
|---|---|---|
| KR | 100876888 B1 | 12/2008 |
| KR | 20140008121 A | 1/2014 |

OTHER PUBLICATIONS

CN first office action in application No. 202111042445.2, mailed on Jun. 27, 2025.

* cited by examiner

SEMICONDUCTOR STRUCTURE AND SEMICONDUCTOR DEVICE

CROSS-REFERENCE TO RELATED APPLICATIONS

This is a continuation of International Application No. PCT/CN2022/110344, filed on Aug. 4, 2022, which claims the priority to Chinese Patent Application No. 202111042445.2, titled "SEMICONDUCTOR STRUCTURE AND SEMICONDUCTOR DEVICE" and filed on Sep. 7, 2021. The entire contents of International Application No. PCT/CN2022/110344 and Chinese Patent Application No. 202111042445.2 are incorporated herein by reference.

TECHNICAL FIELD

The present disclosure relates to the technical field of semiconductors, and in particular, to a semiconductor structure and a semiconductor device.

BACKGROUND

An insulating layer covers a surface of a top conductive layer of a semiconductor structure, and the insulating layer fills a recess in the top conductive layer and forms an air gap. However, the existing semiconductor structure is prone to defects during or after formation of the insulating layer. Consequently, the insulating layer does not cover the top conductive layer tightly, resulting in instability of the semiconductor structure.

SUMMARY

According to one aspect of the present disclosure, a semiconductor structure is provided, including a first conductive layer, a first barrier layer, and an insulating layer, where the first conductive layer includes at least two first traces, and a recess is formed between two adjacent ones of the first traces; the first barrier layer is provided on a sidewall of the recess; and the insulating layer fills the recess, and an air gap is formed in the insulating layer located in the recess.

According to another aspect of the present disclosure, a semiconductor device is provided, where the semiconductor device includes the semiconductor structure described above.

DETAILED DESCRIPTION

Figure 1:
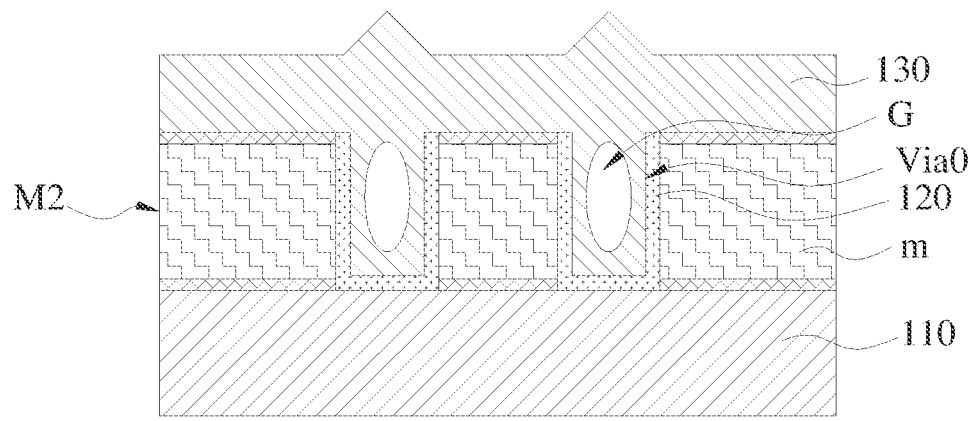
FIG. 1 is a schematic layer diagram of a semiconductor structure according to an exemplary embodiment.

Exemplary embodiments will be described below comprehensively with reference to the drawings. The exemplary embodiments may be implemented in various forms, and may not be construed as being limited to those described herein. On the contrary, these exemplary embodiments are provided to make the present disclosure comprehensive and complete and to fully convey the concept manifested therein to those skilled in the art. The same reference numerals in the figures indicate the same or similar structures, and thus their detailed descriptions will be omitted.

FIG. 1 representatively illustrates a schematic layer diagram of a semiconductor structure provided in the present disclosure in a first embodiment. In this exemplary embodiment, the semiconductor structure provided in the present disclosure is described by using an example in which the semiconductor structure is applied to a dynamic random access memory (DRAM). It is understandable for those skilled in the art that, in order to apply the relevant design of the present disclosure to other types of semiconductor structures, various modifications, additions, substitutions, deletions, or other changes may be made to the following specific embodiments, but such changes still fall within the scope of the principle of the semiconductor structure proposed by the present disclosure.

As shown in FIG. 1, in this embodiment, the semiconductor structure provided in the present disclosure includes at least a first conductive layer M2, a first barrier layer 120, and an insulating layer 130. Specifically, the first conductive layer M2 is provided on a device layer 110 and is electrically connected to a device in the device layer 110, to transmit a signal for the device in the device layer 110. In addition, the first conductive layer M2 includes at least two first traces m, and a recess Via0 is formed between two adjacent ones of the first traces m. The first barrier layer 120 is provided on a sidewall of the recess Via0. The insulating layer 130 fills the recess Via0, and an air gap G is formed in the insulating layer 130 located in the recess Via0. Through the foregoing design, the present disclosure can use the first barrier layer 120 to effectively prevent external water vapor from penetrating the first conductive layer M2 and other structures through the insulating layer 130, and an electromigration phenomenon between adjacent first traces m of the first conductive layer M2 can be effectively prevented by using the first barrier layer 120. It should be noted that, the first conductive layer M2 may be in direct contact with, or may be electrically connected, through another conductive layer, to the device layer 110.

In some embodiments, as shown in FIG. 1, in this embodiment, the first barrier layer 120 may alternatively be provided on a bottom wall of the recess Via0. Through the foregoing design, the semiconductor structure can use the first barrier layer 120 provided on the bottom wall of the recess Via0 to further prevent the external water vapor from penetrating the device layer 110 through the recess Via0.

Figure 2:
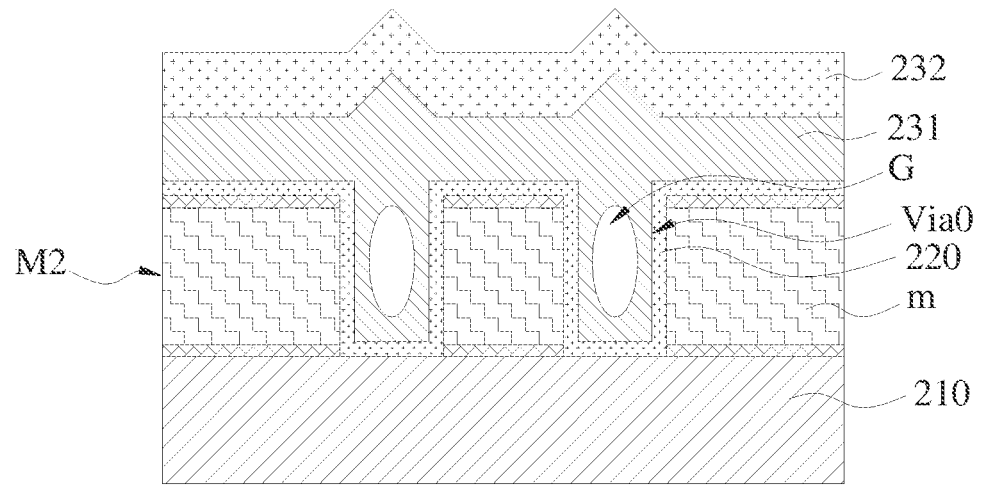
FIG. 2 to FIG. 5 are each a schematic layer diagram of a semiconductor structure according to a plurality of other exemplary embodiments.

As shown in FIG. 2, in some embodiments, the semiconductor structure provided in the present disclosure includes at least a first conductive layer M2, a first barrier layer 220, and an insulating layer 231. Specifically, the first conductive layer M2 is provided on a device layer 210 and is electrically connected to a device in the device layer 210, to transmit a signal for the device in the device layer 210. In addition, the first conductive layer M2 includes at least two first traces m, and a recess Via0 is formed on a top surface between two adjacent ones of the first traces m. The first barrier layer 220 is provided on a sidewall of the recess Via0. The insulating layer 231 fills the recess Via0, and an air gap G is formed in the insulating layer 231 located in the recess Via0. Through the foregoing design, the present disclosure can use the first barrier layer 220 to effectively prevent external water vapor from penetrating the first conductive layer M2 and other structures through the insulating layer 231, and an electromigration phenomenon between adjacent first traces m of the first conductive layer M2 can be effectively prevented by using the first barrier layer 220. It should be noted that, the first conductive layer M2 may be in direct contact with, or may be electrically connected, through another conductive layer, to the device layer 210.

In some embodiments, as shown in FIG. 2, the first barrier layer 220 is alternatively provided on the top surface of the first conductive layer M2. The semiconductor structure can use the first barrier layer 220 provided on the top surface of the first conductive layer M2 to further prevent the external water vapor from penetrating through the top surface of the first conductive layer M2.

In some embodiments, as shown in FIG. 1 and FIG. 2, a reference direction is defined, and the reference direction is from the top surface of the first conductive layer M2 to a bottom surface of the first conductive layer M2. In the reference direction, an extension length of the air gap G is less than a thickness of the first conductive layer M2. For example, a ratio of the extension length of the air gap G to the thickness of the first conductive layer M2 may be $\frac{1}{2}$ to $\frac{4}{5}$, for example $\frac{1}{2}$, $\frac{4}{7}$, $\frac{3}{5}$, or $\frac{4}{5}$. In some embodiments, the ratio of the extension length of the air gap G to the thickness of the first conductive layer M2 may alternatively be less than $\frac{1}{2}$ or greater than $\frac{4}{5}$, for example, may be $\frac{3}{8}$ or $\frac{7}{8}$, which is not limited thereto. In addition, as shown in FIG. 1, in some embodiments, the air gap G may extend from the top of the recess Via0 to the bottom of the recess Via0. In other words, in the reference direction, the extension length of the air gap G may be slightly less than (approximately equal to) the thickness of the first conductive layer M2, and a size difference therebetween may be 1 nm to 100 nm.

Figure 3:
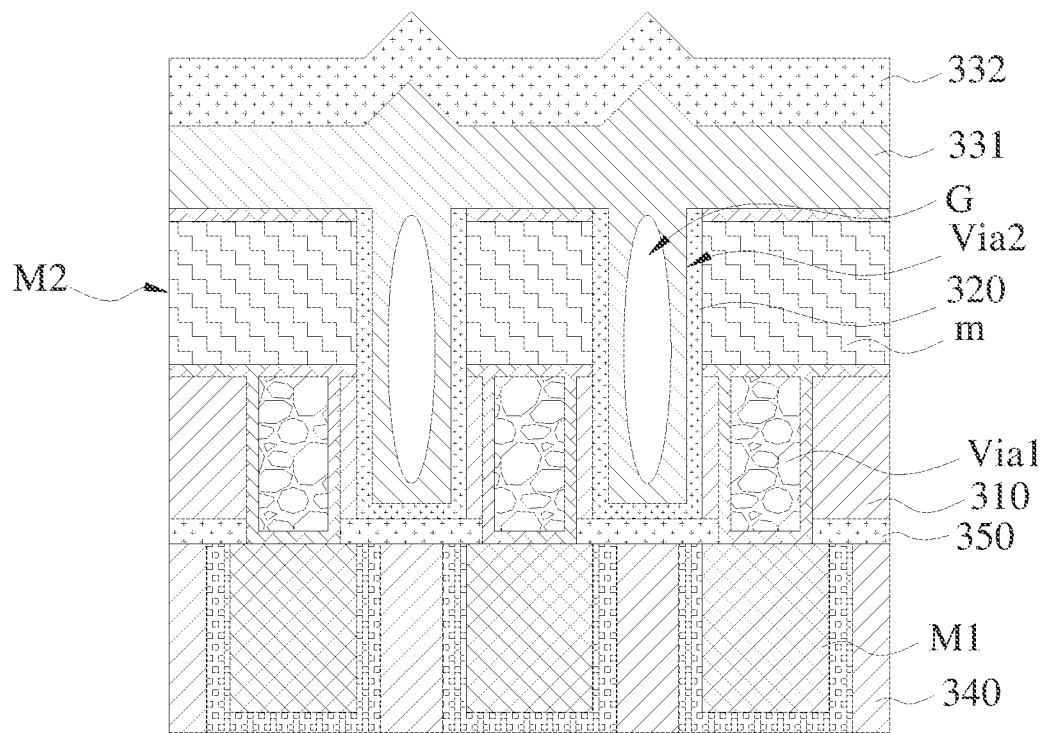

As shown in FIG. 3, in some embodiments, the semiconductor structure includes a first dielectric layer 310, the first conductive layer M2, a first barrier layer 320, an insulating layer, a second dielectric layer 340, a second barrier layer 350, and a second conductive layer M1. Specifically, the first conductive layer M2 is provided on a top surface of the first dielectric layer 310, the first conductive layer M2 includes at least two first traces m, and a recess Via2 is formed between two adjacent ones of the first trace m. The first barrier layer 320 is provided on a sidewall of the recess Via2. The insulating layer may include a first insulating layer 331 and a second insulating layer 332. The first insulating layer 331 is provided on a top surface of the first conductive layer and fills the recess Via2, and an air gap G is formed in the first insulating layer 331 located in the recess Via2. The second insulating layer 332 is provided on a top surface of the first insulating layer 331. The second dielectric layer 340 is located below the first dielectric layer 310. The second barrier layer 350 is provided between a bottom surface of the first dielectric layer 310 and a top surface of the second dielectric layer 340. The second conductive layer M1 is provided in the second dielectric layer 340. The second conductive layer M1 includes at least two second traces, and each of the second traces of the second conductive layer M1 is connected to each of the first traces m of the first conductive layer M2 by a first interconnect structure Via1 running through the second barrier layer 350 and the first dielectric layer 310.

In some embodiments, as shown in FIG. 3, the first barrier layer 320 may alternatively be provided on a bottom wall of the recess Via2. Through the foregoing design, the semiconductor structure can use the first barrier layer 320 provided on the bottom wall of the recess Via2 to further prevent the external water vapor from penetrating through the top surface of the first dielectric layer 310.

Figure 4:
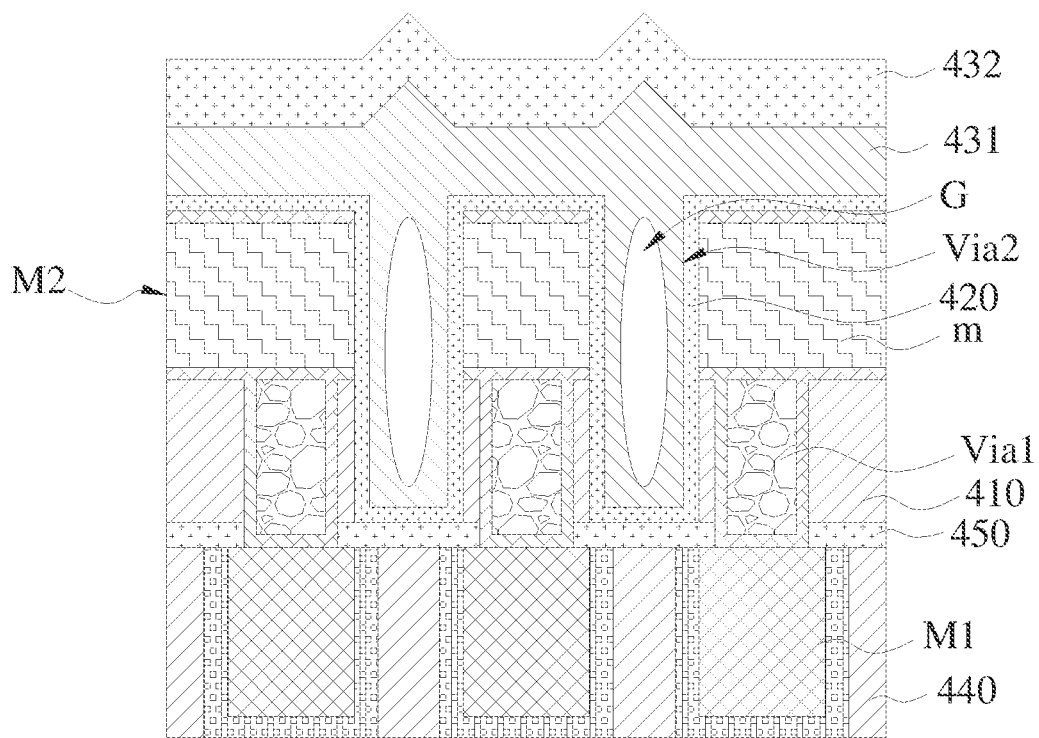

As shown in FIG. 4, in some embodiments, a first barrier layer 420 may be further provided on a top surface of the first conductive layer M2. Through the foregoing design, the semiconductor structure can use the first barrier layer 420 provided on the top surface of the first conductive layer M2 to further prevent the external water vapor from penetrating through the top surface of the first conductive layer M2.

As shown in FIG. 3 and FIG. 4, orthographic projection of the recess Via2 on the top surface of the first conductive layer M2 and orthographic projection of the first interconnect structure Via1 on the top surface of the first conductive layer M2 are arranged in a staggered manner.

As shown in FIG. 3, the recess Via2 may run through the first dielectric layer 310, and the recess Via2 extends to the second barrier layer 350. A top surface of the second barrier layer 350 exposed in the recess Via2 defines a bottom wall of the recess Via2, that is, the first barrier layer 320 is provided on the top surface of the second barrier layer 350 exposed in the recess Via2. On this basis, a reference direction is defined, and the reference direction is a direction from the top surface of the first conductive layer M2 to a bottom surface of the first conductive layer M2. In the reference direction, an extension length of the air gap G is greater than a thickness of the first conductive layer M2 and less than a sum of thicknesses of the first conductive layer M2 and the first dielectric layer 310. Through the foregoing design, the air gap G can extend to the first dielectric layer 310 in the reference direction, such that the dielectric property between the first conductive layer M2 and the first dielectric layer 310 can be effectively reduced, thereby helping reduce an RC delay.

In some embodiments, as shown in FIG. 3, in the reference direction, on the basis that the extension length of the air gap G is greater than the thickness of the first conductive layer M2, a ratio of the extension length of the air gap G to the sum of the thicknesses of the first conductive layer M2 and the first dielectric layer 310 may be $\frac{1}{2}$ to $\frac{4}{5}$, for example, $\frac{1}{2}$, $\frac{4}{7}$, $\frac{3}{5}$, or $\frac{4}{5}$, such that an electromigration phenomenon between first traces m of the first conductive layer M2 can be further well prevented.

In some embodiments, the ratio of the extension length of the air gap G to the sum of the thicknesses of the first conductive layer M2 and the first dielectric layer 310 may alternatively be less than $\frac{1}{2}$ or greater than $\frac{4}{5}$, for example, may be $\frac{3}{8}$ or $\frac{7}{8}$, which is not limited thereto.

In some embodiments, as shown in FIG. 3, the air gap G may extend from the top of the recess Via2 to the bottom of the recess Via2. In other words, in the reference direction, the extension length of the air gap G may be slightly less than (approximately equal to) the thickness of the first conductive layer M2, and a size difference therebetween may be 1 nm to 100 nm.

Figure 5:
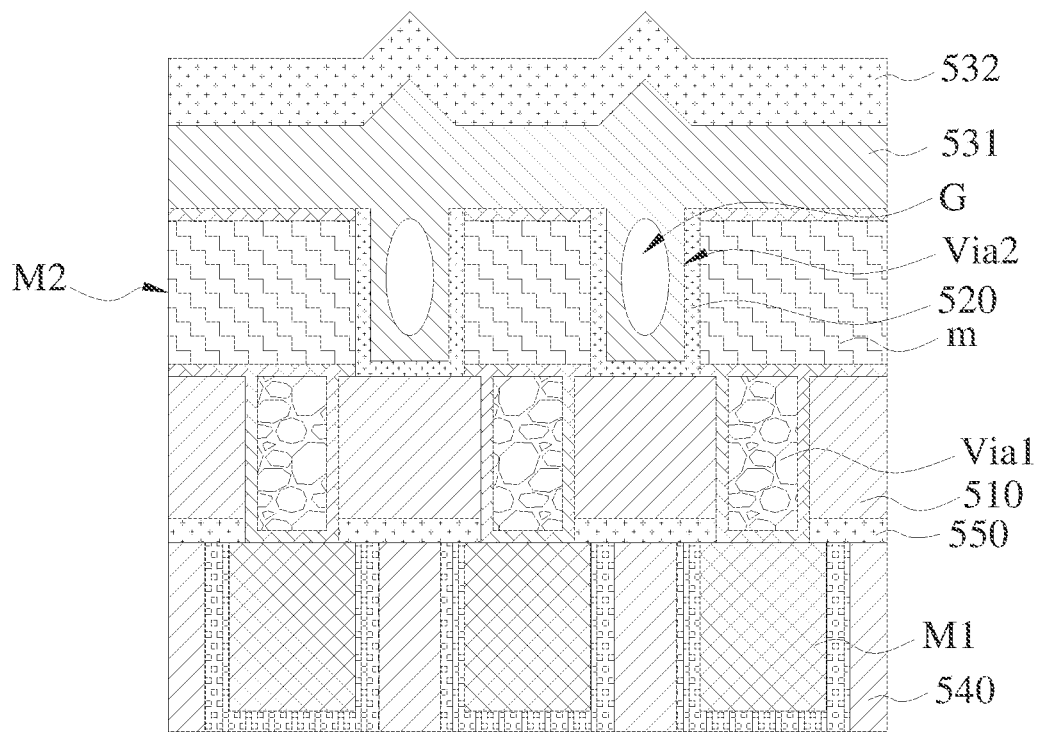

In addition, as shown in FIG. 5, in some embodiments, on the basis that the semiconductor structure further includes a second dielectric layer 540, a second barrier layer 550, and the second conductive layer M1, the recess Via2 may alternatively extend only to a top surface of a first dielectric layer 510, that is, the recess Via2 does not run through the first dielectric layer 510. In this case, the top surface of the first dielectric layer 510 is partially exposed in the recess Via2, that is, part of the top surface of the first dielectric layer 510 exposed in the recess Via2 defines a bottom wall of the recess Via2. On this basis, in the reference direction, the extension length of the air gap G is less than the thickness of the first conductive layer M2.

Optionally, the first barrier layer 320 is made of a same material as the second barrier layer 350, for example, silicon nitride.

Optionally, a material of the interconnect structure Via1 may include tungsten (W).

Optionally, in this embodiment, a material of the first barrier layer 120 may include silicon nitride ($Si_3N_4$).

Optionally, as shown in FIG. 1, in this embodiment, the insulating layer 130 may alternatively cover the top surface of the first conductive layer M2.

Optionally, in this embodiment, a material of the insulating layer 130 may include silicon oxide ($SiO_2$).

Optionally, a material of the first conductive layer M2 may include aluminum.

As shown in FIG. 2, in some embodiments, the insulating layer may include a first insulating layer 231 and a second insulating layer 232. Specifically, the first insulating layer 231 covers the first conductive layer M2 and fills the recess Via0, and an air gap G is formed in the first insulating layer 231 located in the recess Via0. The second insulating layer 232 is provided on a top surface of the first insulating layer 231. In other embodiments, the first insulating layer 231 may alternatively only fill the recess Via0, and the second insulating layer 232 may cover a top surface of the first insulating layer 231 and a top surface of the first conductive layer M2.

Further, a material of the first insulating layer 231 may include silicon oxide.

Further, a material of the second insulating layer 232 may include silicon nitride.

In some embodiments, the semiconductor structure of the present disclosure further includes at least one third conductive layer and at least one third barrier layer. The third conductive layer includes a plurality of third traces and a third dielectric layer. The third dielectric layer is provided between two adjacent ones of the third traces. The third barrier layer and the third conductive layer are sequentially laminated on one side of the second dielectric layer away from the second conductive layer.

The third conductive layer closest to the second dielectric layer is connected to the second conductive layer by a second interconnect structure running through the second dielectric layer and the third barrier layer. Two adjacent ones of the third conductive layer are connected by a third interconnect structure running through the third barrier layer and the third dielectric layer.

It should be noted herein that the semiconductor structure shown in the drawings and described in this specification only show a few examples of many semiconductor structures that can adopt the principle of the present disclosure. It should be clearly understood that the principle of the present disclosure is by no means limited to any details or any structures of the semiconductor structure shown in the drawings or described in this specification.

Based on the semiconductor structure described above, the present disclosure further provides a semiconductor device. The semiconductor device includes the semiconductor structure described above. For example, the semiconductor device is a memory. The memory includes a memory cell array and a peripheral circuit. The peripheral circuit may include the semiconductor structure for leading out a corresponding signal. An RC delay in the semiconductor structure is reduced, such that it correspondingly helps improve overall performance of the memory.

Based on the foregoing detailed description of the semiconductor structure provided in the present disclosure, the following describes an exemplary embodiment of a method of manufacturing a semiconductor structure provided in the present disclosure.

Figure 6:
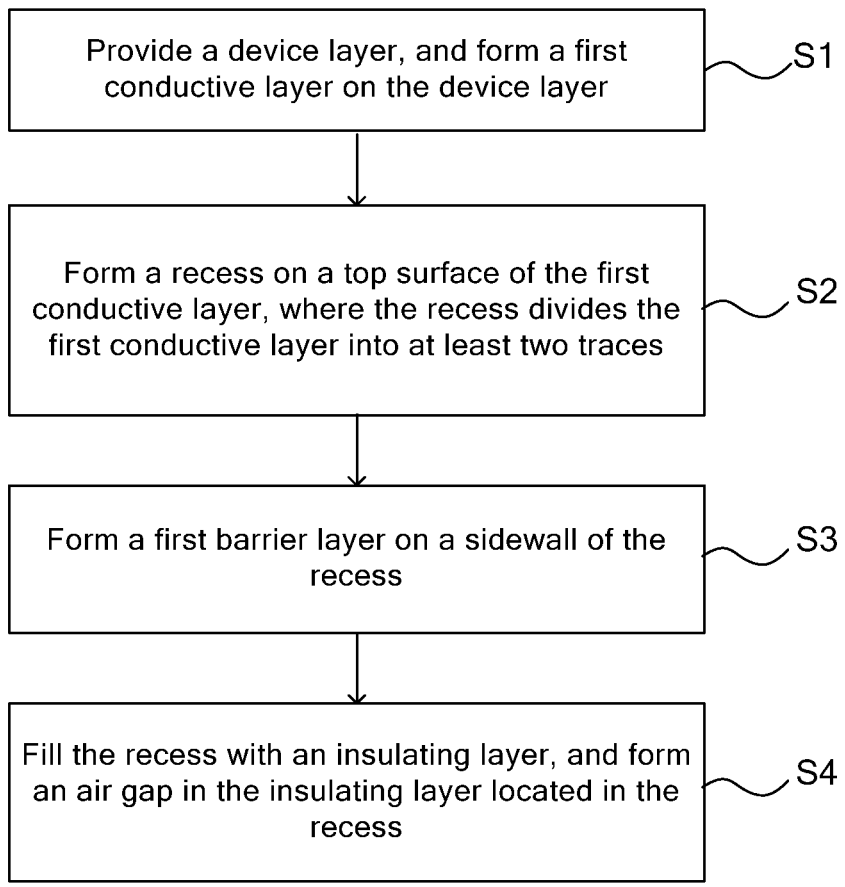
FIG. 6 is a schematic flowchart of a method of manufacturing a semiconductor structure according to an exemplary embodiment.

FIG. 6 representatively illustrates a schematic flowchart of a method of manufacturing a semiconductor structure according to the present disclosure. In the exemplary embodiment, the manufacturing method provided in the present disclosure is described by using an example in which it is applied to a DRAM. It is understandable for those skilled in the art that, in order to apply the relevant design of the present disclosure to other types of semiconductor structures, various modifications, additions, substitutions, deletions, or other changes may be made to the following specific embodiments, but such changes still fall within the scope of the principle of the method of manufacturing a semiconductor structure provided in the present disclosure.

As shown in FIG. 6, the method of manufacturing a semiconductor structure provided in the present disclosure includes:

Step S1: Provide a device layer, and form a first conductive layer on the device layer.

Step S2: Form a recess on a top surface of the first conductive layer, where the recess divides the first conductive layer into at least two traces.

Step S3: Form a first barrier layer on a sidewall of the recess.

Step S4: Fill the recess with an insulating layer, and form an air gap in the insulating layer located in the recess.

Using the semiconductor structure shown in FIG. 1 as an example, referring to FIG. 7 to FIG. 10, FIG. 7 to FIG. 10 and FIG. 1 each representatively illustrate a schematic layer diagram of a semiconductor structure in a plurality of steps of a method of manufacturing a semiconductor structure.

Figure 7:
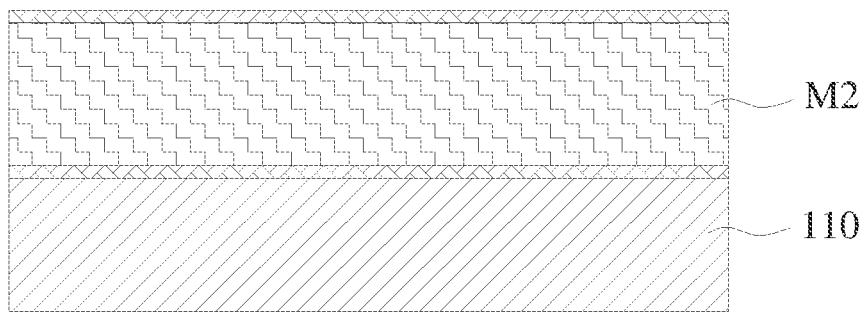
FIG. 7 to FIG. 10 are each a schematic layer diagram of a semiconductor structure in a plurality of steps of the method of manufacturing a semiconductor structure shown in FIG. 6.

Specifically, FIG. 7 specifically illustrates a schematic layer diagram of a semiconductor structure in step S1. In this embodiment, in step S1, the semiconductor structure includes the device layer 110 and the first conductive layer M2. The first conductive layer M2 is provided on a top surface of the device layer 110.

Optionally, in step S2, part of the first conductive layer may be removed through an etching process to form at least two traces, a recess is formed between two adjacent ones of the traces, and an etching stop location in the etching process defines a recess bottom location of the recess. For example, in a first embodiment of the semiconductor structure, when part of the first conductive layer is removed through an etching process to form a recess, an etching stop location of the etching process is the top surface of the device layer. For another example, in a second embodiment of the semiconductor structure, when part of the first conductive layer is removed through an etching process to form a recess, an etching stop location of the etching process is a top surface of a second barrier layer, that is, the etching process removes not only part of the first conductive layer but also part of the first dielectric layer.

Further, based on the process design of removing part of the first conductive layer through an etching process to form a recess, step S2 may include the following steps:

S21: Provide a photoresist layer on the top surface of the first conductive layer.

S22: Pattern the photoresist layer to form a photolithography pattern opening.

S23: Etch the first conductive layer by using the patterned photoresist layer as a mask to form a recess, where a location of the recess corresponds to the photolithography pattern opening.

Figure 8:
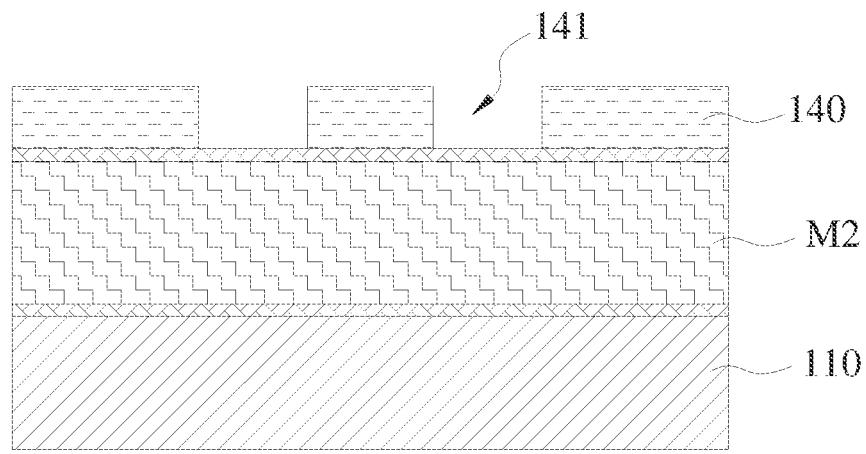

Specifically, FIG. 8 specifically illustrates a schematic layer diagram of the semiconductor structure in step S22. In step S22, the semiconductor structure includes the device layer 110, the first conductive layer M2, and a patterned photoresist layer 140. The photoresist layer 140 is provided on the top surface of the first conductive layer M2, and the photoresist layer 140 is patterned to form a photolithography pattern opening 141.

Figure 9:
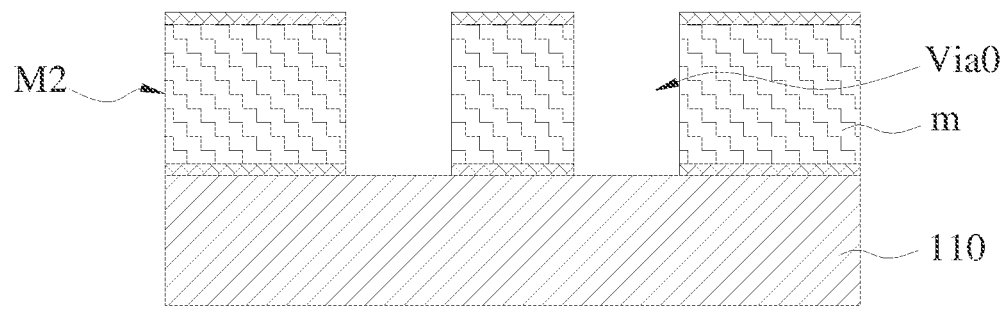

Specifically, FIG. 9 specifically illustrates a schematic layer diagram of the semiconductor structure in step S23 (or step 2). In step S22, the semiconductor structure includes the device layer 110 and the first trace m remaining after the first conductive layer M2 is partially removed. A part of the first conductive layer M2 exposed in the photolithography pattern opening 141 is removed by etching to form a plurality of first traces m, and a recess Via0 is formed between two adjacent ones of the first traces m.

Figure 10:
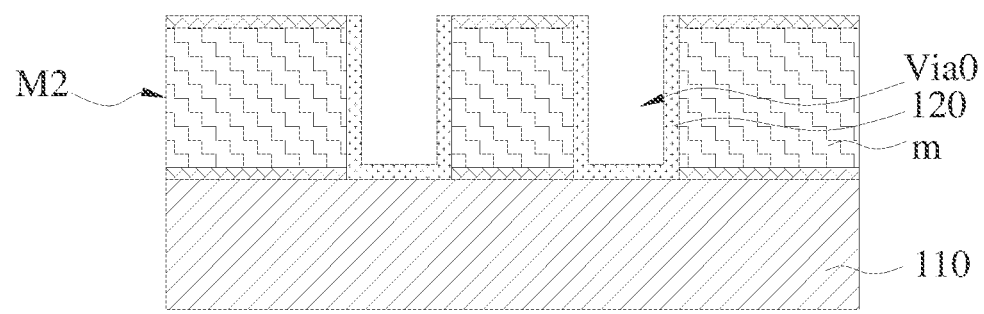

Specifically, FIG. 10 specifically illustrates a schematic layer diagram of the semiconductor structure in step S3. In step S3, the semiconductor structure includes the device layer 110, the first conductive layer M2, and the first barrier layer 120. The first barrier layer 120 is provided on a sidewall of the recess Via0. On this basis, the first barrier layer 120 may alternatively be provided on a bottom wall of the recess Via0.

Optionally, in step S3, the first barrier layer may be formed through a deposition process, for example, but not limited to, an atomic layer deposition (ALD) process or a chemical vapor deposition (CVD) process.

Specifically, FIG. 1 specifically illustrates a schematic layer diagram of the semiconductor structure in step S4. In step S4, the semiconductor structure includes the device layer 110, the first conductive layer M2, the first barrier layer 120, and the insulating layer 130. The insulating layer 130 is provided on the top surface of the first conductive layer M2, and the insulating layer 130 fills the recess Via0. The air gap G is formed in the insulating layer 130 located in the recess Via0.

Optionally, in step S4, the insulating layer 130 may alternatively cover the top surface of the first conductive layer M2.

Optionally, in step S4, the insulating layer 130 may be formed through a deposition process, and a location and a size of the air gap G can be controlled by using high density plasma during the deposition.

Using the semiconductor structure shown in FIG. 4 as an example, referring to FIG. 11 to FIG. 15, FIG. 11 to FIG. 15 and FIG. 4 each representatively illustrate a schematic layer diagram of a semiconductor structure in a plurality of steps of a method of manufacturing a semiconductor structure.

Figure 11:
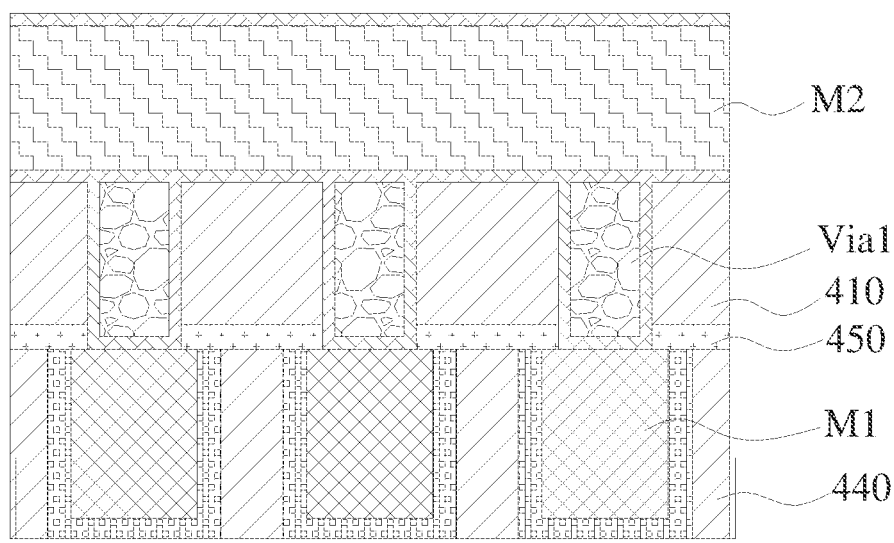
FIG. 11 to FIG. 15 are each a schematic layer diagram of a semiconductor structure in a plurality of steps of a method of manufacturing a semiconductor structure according to another exemplary embodiment.

As shown in FIG. 11, before the preparation of the first conductive layer M2 in step S1, a second conductive layer M1, a second dielectric layer 440, and a second barrier layer 450, a first dielectric layer 410, and a first interconnect structure Via1 are first sequentially formed on the device layer 110, and then steps S1 to S4 are performed on the first dielectric layer 410. The first conductive layer M2 is provided on a top surface of the first dielectric layer 410. The second conductive layer M1 includes a plurality of second traces. The second dielectric layer 440 is provided between two adjacent ones of the second traces and located below the first dielectric layer 410. The second barrier layer 450 is provided between the second dielectric layer 440 and the first dielectric layer 410. The second conductive layer M1 is connected to the first conductive layer M2 through the first interconnect structure Via1 running through the first dielectric layer 410 and the second barrier layer 450.

It should be noted that, in various possible embodiments meeting the design ideas of the present disclosure, the method of manufacturing a semiconductor structure is applicable to a semiconductor structure including one conductive layer or a semiconductor structure including two or more conductive layers. For example, when the semiconductor structure includes two or more conductive layers, a device layer including two or more conductive layers may be provided in step S1, and a recess may be provided on a conductive layer located on top in step S2.

Optionally, in step S2, part of the first conductive layer M2 may be removed through an etching process to form a plurality of first traces m, and a recess Via2 is formed between two adjacent ones of the first traces m. Specifically, an etching stop location in this embodiment is a top surface of the second barrier layer 450, that is, the etching process removes not only part of the first conductive layer M2 but also part of the first dielectric layer 410.

Figure 12:
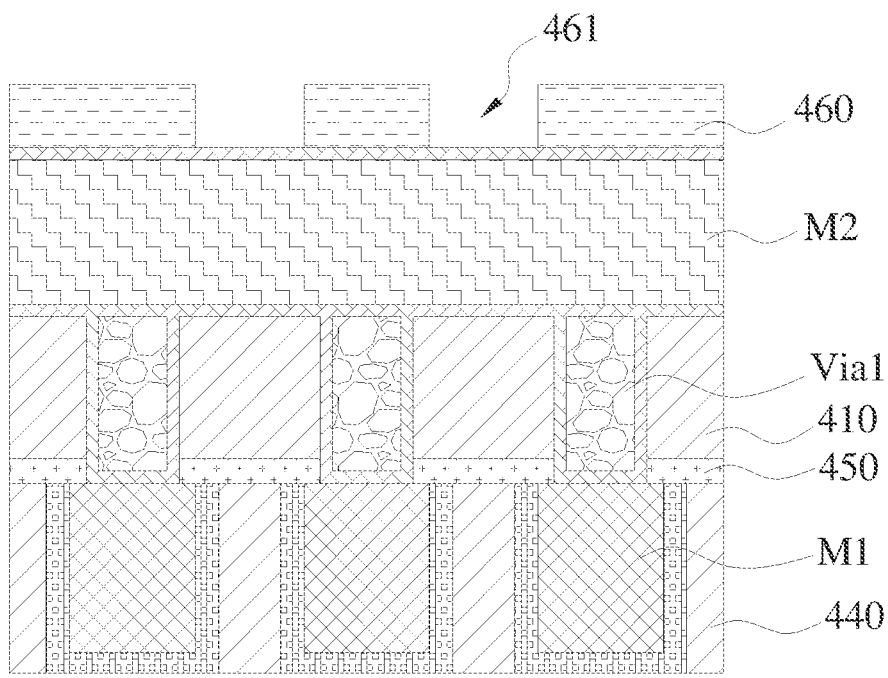

Specifically, as shown in FIG. 12, in step S22, the semiconductor structure includes a device layer and a photoresist layer 460. The photoresist layer 460 is provided on the top surface of the first conductive layer M2, and the photoresist layer 460 is patterned to form a photolithography pattern opening 461.

Figure 13:
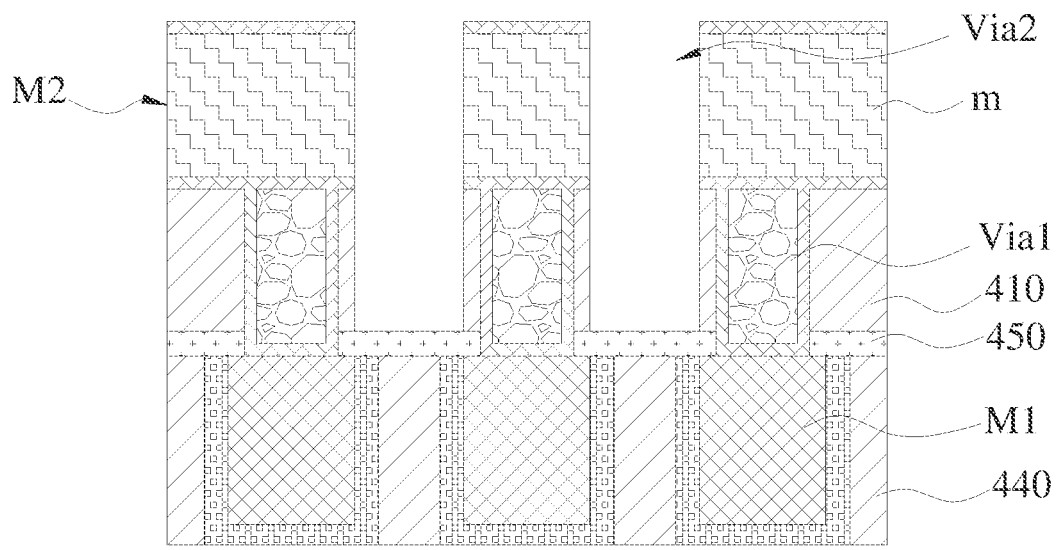

Specifically, as shown in FIG. 13, in step S23 (or step 2), a part of the first conductive layer M2 exposed in the photolithography pattern opening 461 is removed by etching to form a plurality of first traces m, and a recess Via2 is formed between two adjacent ones of the first traces m.

Figure 14:
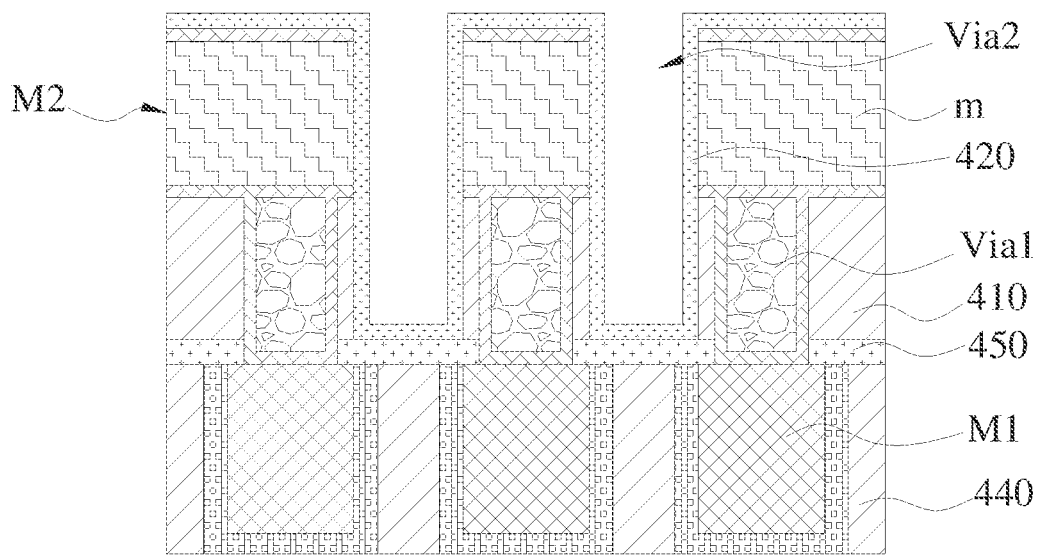

Specifically, as shown in FIG. 14, in step S3, the semiconductor structure includes a device layer and a first barrier layer 420. The first barrier layer 420 is provided on a bottom wall and a sidewall of the recess Via2.

Figure 15:
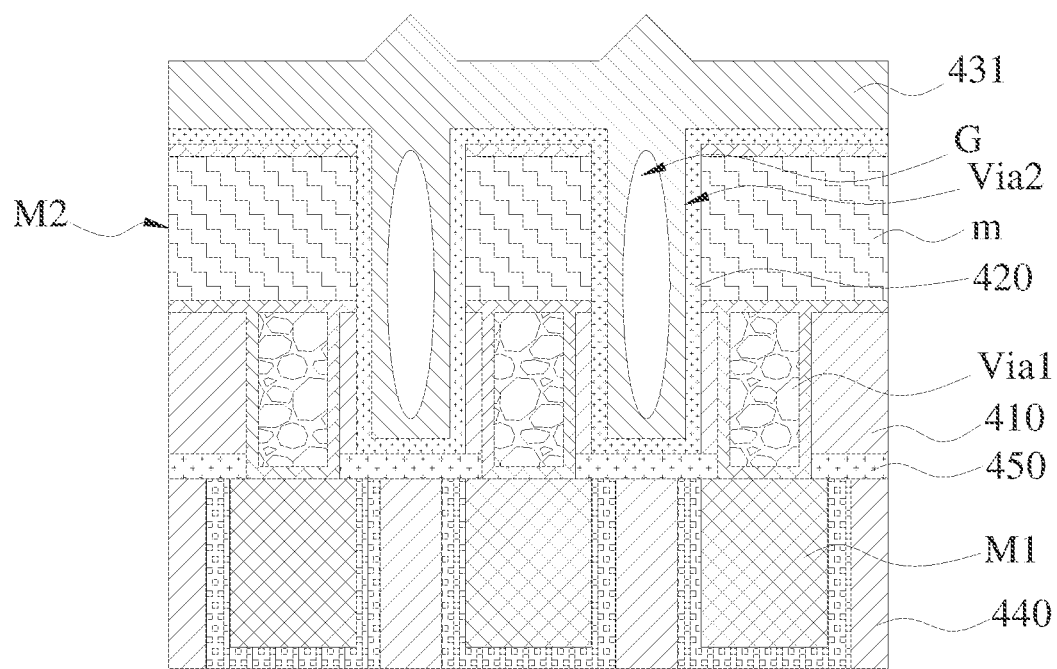

Specifically, as shown in FIG. 15, in step S4, the semiconductor structure includes a device layer, a first barrier layer 420, and a first insulating layer 431. The first insulating layer 431 fills the recess Via2, and an air gap G is formed in the first insulating layer 431 located in the recess Via2.

Optionally, in step S4, the first insulating layer 431 may alternatively cover the top surface of the first conductive layer M2.

Optionally, as shown in FIG. 15, in step S4, the first insulating layer 431 may be formed through a deposition process, and a location and a size of the air gap G can be controlled by using high density plasma during the deposition. For example, an extension length of the air gap G may be controlled to be slightly less than (approximately equal to) a thickness of the first conductive layer M2 in a reference direction. Through the foregoing design, the air gap G can extend to the first dielectric layer 410 in the reference direction, such that the dielectric property between the first conductive layer M2 and the first dielectric layer 410 can be effectively reduced, thereby helping reduce an RC delay.

Optionally, as shown in FIG. 4, after the step of providing the first insulating layer 431, a second insulating layer 432 may be further provided on a top surface of the first insulating layer 431.

It should be noted herein that the method of manufacturing a semiconductor structure shown in the drawings and described in this specification only show a few examples of many manufacturing methods that can adopt the principle of the present disclosure. It should be clearly understood that the principle of the present disclosure is by no means limited to any details or any steps of the method of manufacturing a semiconductor structure shown in the drawings or described in this specification.

In summary, the semiconductor structure provided in the present disclosure includes a first conductive layer, a first barrier layer, and an insulating layer, the first conductive layer includes at least two traces, and a recess is formed between two adjacent ones of the traces. In the present disclosure, the first barrier layer is provided on the sidewall of the recess, which can effectively prevent external water vapor from penetrating the first conductive layer and other structures through the insulating layer. In addition, an electromigration phenomenon between adjacent traces of the first conductive layer can be effectively prevented by using the first barrier layer.

The present disclosure is described above with reference to several typical implementations. It should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A semiconductor structure, comprising:
   a first conductive layer comprising at least two first traces, wherein a recess is formed between two adjacent ones of the first traces;
   a first barrier layer provided on a sidewall of the recess;
   an insulating layer filling the recess, wherein an air gap is formed in the insulating layer located in the recess;
   a first dielectric layer provided on a bottom surface of the first conductive layer, wherein the recess runs through the first conductive layer;
   a second dielectric layer located below the first dielectric layer;
   a second barrier layer provided between the first dielectric layer and the second dielectric layer; and
   a second conductive layer comprising a plurality of second traces, wherein the second dielectric layer is provided between two adjacent ones of the second traces, and the second trace is connected to the first conductive layer by a first interconnect structure running through the second barrier layer and the first dielectric layer;
   wherein the recess runs through the first dielectric layer and extends to the second barrier layer, and a top surface of the second barrier layer exposed in the recess defines a bottom wall of the recess.

2. The semiconductor structure according to claim 1, wherein the first barrier layer is further provided on at least one of a top surface of the first conductive layer or a bottom wall of the recess.

3. The semiconductor structure according to claim 1, wherein along a direction from a top surface of the first conductive layer to a bottom surface of the first conductive layer, an extension length of the air gap is less than a thickness of the first conductive layer.

4. The semiconductor structure according to claim 1, wherein the recess further runs through the first dielectric layer, and along a direction from a top surface of the first conductive layer to the bottom surface of the first conductive layer, an extension length of the air gap is greater than a thickness of the first conductive layer and less than a sum of thicknesses of the first conductive layer and the first dielectric layer.

5. The semiconductor structure according to claim 1, wherein the first barrier layer is made of a same material as the second barrier layer.

6. The semiconductor structure according to claim 1, wherein orthographic projection of the recess on a top surface of the first conductive layer and orthographic projection of the first interconnect structure on the top surface of the first conductive layer are arranged in a staggered manner.

7. The semiconductor structure according to claim 1, wherein the semiconductor structure further comprises at least one third conductive layer and at least one third barrier layer, the third conductive layer comprises a plurality of third traces and a third dielectric layer, the third dielectric layer is provided between two adjacent ones of the third traces, and the third barrier layer and the third conductive layer are sequentially laminated on one side of the second dielectric layer away from the second conductive layer, wherein
   the third conductive layer closest to the second dielectric layer is connected to the second conductive layer by a second interconnect structure running through the second dielectric layer and the third barrier layer, and two adjacent ones of the third conductive layers are connected by a third interconnect structure running through the third barrier layer and the third dielectric layer.

8. The semiconductor structure according to claim 1, wherein a material of the first barrier layer comprises silicon nitride.

9. The semiconductor structure according to claim 1, wherein the insulating layer comprises:
   a first insulating layer provided on a top surface of the first conductive layer and filling the recess, wherein the air gap is formed in the first insulating layer located in the recess; and
   a second insulating layer provided on a top surface of the first insulating layer.

10. The semiconductor structure according to claim 9, wherein at least one of:
    a material of the first insulating layer comprises silicon oxide; or
    a material of the second insulating layer comprises silicon nitride.

11. The semiconductor structure according to claim 1, wherein a material of the first conductive layer comprises aluminum.

12. A semiconductor device, wherein the semiconductor device comprises the semiconductor structure according to claim 1.

* * * * *